Figure 4:
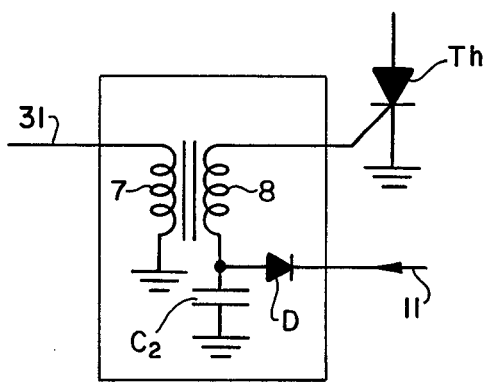

United States Patent [19]

Riechmann

[11] 4,132,929
[45] Jan. 2, 1979

[54] TELEVISION VERTICAL DEFLECTION CIRCUIT

[75] Inventor: Werner Riechmann, Sibbesse, Germany

[73] Assignee: Blaupunkt-Werke GmbH, Hildesheim, Germany

[21] Appl. No.: 822,514

[22] Filed: Aug. 8, 1977

[30] Foreign Application Priority Data

Aug. 28, 1976 [DE] Fed. Rep. of Germany ....... 2638872

[51] Int. Cl.² .................. H01J 29/70; H01J 29/72
[52] U.S. Cl. ................................. 315/408; 315/387
[58] Field of Search ............... 315/408, 399, 387, 393

[56] References Cited

U.S. PATENT DOCUMENTS

| | | | |
|---|---|---|---|
| 3,993,931 | 11/1976 | Den Hollander | 315/408 |
| 4,037,137 | 7/1977 | Dietz | 315/408 |
| 4,048,544 | 9/1977 | Haferl | 315/408 |

*Primary Examiner*—Theodore M. Blum
*Attorney, Agent, or Firm*—Flynn & Frishauf

[57] ABSTRACT

A saw-tooth wave generator including thyristors is provided in the vertical deflection circuit, the thyristors controlling charging and re-charging of a charge capacitor. A portion of the energy contained in the line retrace and delivered from the horizontal output stage is used in order to provide current for the vertical deflection coil. In order to prevent spurious or erroneous operation of the thyristors, an oppositely poled bias voltage is applied to the gates of the thyristors during the pauses or intervals of triggering of the thyristors, the bias voltage being derived externally or directly from the thyristor control circuit, for example by utilizing the inductive reverse-polarity kick of an inductance connecting the thyristor gate to its control circuit, by a charge-reverse re-charge circuit of a capacitor, or the like.

11 Claims, 6 Drawing Figures

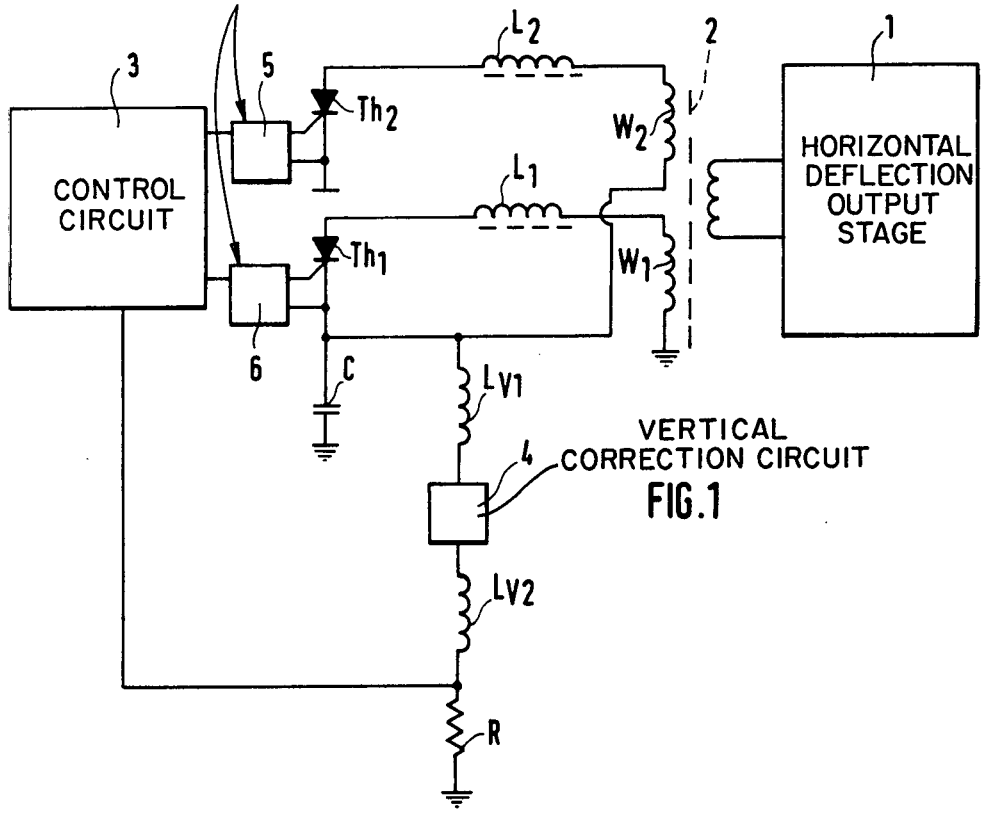
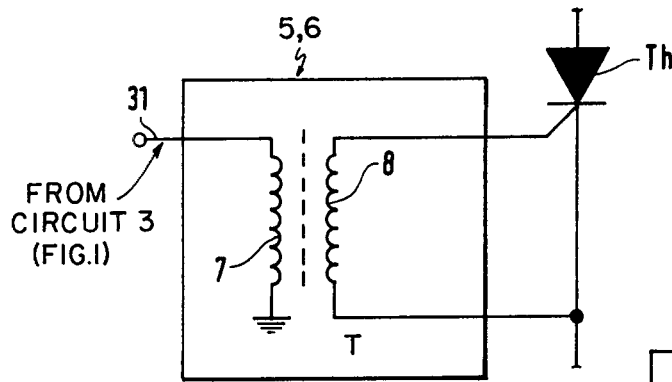
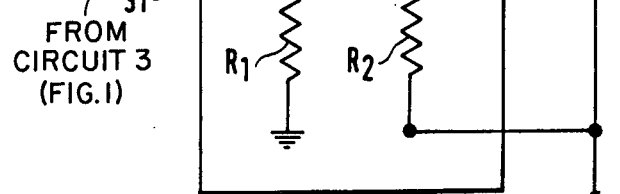

TELEVISION VERTICAL DEFLECTION CIRCUIT

REFERENCE TO RELATED PRIOR ART U.S. Pat. No. 4,048,544, Hoferl (assigned RCA).

The present invention relates to television receiver circuits, and more particularly to the vertical deflection circuit therein.

BACKGROUND AND PRIOR ART

Vertical deflection is controlled in television receivers by vertical deflection circuits, in which a pulse generator is synchronized by the video signals. The pulses so obtained are then applied to the deflection system over a pulse transfer and wave-shaping stage, a driver stage, and a final or power or output stage.

A vertical deflection circuit of the type to which the present invention relates is described, for example, is German Disclosure Document DT-OS No. 2,355,872, which shows a transistorized vertical deflection circuit which is so arranged that the pulses are stabilized. It has been found that this type of vertical deflection circuit has some disadvantages; the transistors are operated at high voltage and can be destroyed if excessive voltages occur resulting in voltage flash-over. The output power transistors have to be supplied already with substantial power, resulting in poor efficiency of the overall deflection circuit.

An other known vertical deflection circuit as shown, for example, in U.S. Pat. No. 4,085,544, Hoferl (assigned RCA) avoids the difficulties above referred-to by utilizing the energy contained in the line retrace or line flyback. A portion of this energy delivered by the line deflection power or output stage is utilized in order to supply the current to the vertical deflection system, typically the vertical deflection coils. The vertical deflection coils then utilize a controlled saw-tooth wave generator having two thyristors which control charge and reverse re-charge of the capacitor. This saw-tooth wave generator with the two thyristors and the capacitor is connected in advance of the output stage of the vertical deflection circuitry. Unfortunately, this vertical deflection circuit also has some disadvantages.

If the vertical deflection coils have a high impedance, the final or output stages must supply a voltage at a high level. This, in turn, results in high transient loading of voltage change with respect to time at the terminals of the thyristors. These high and rapidly occurring changes in voltage result in a comparatively long recovery time of the thyristors. Under certain conditions, the thyristors cannot recover until the next trigger pulse appears and it is then no longer possible to trigger the thyristors as commanded. This results in interference and disturbances and possibly even failure of vertical deflection. Additionally, the thyristors can be destroyed or damaged due to overloading.

It is an object of the present invention to utilize the advantages of the circuit of U.S. Pat. No. 4,048,544 without incurring the disadvantages, and which is suitable for operation with high-resistance vertical deflection coils having high impedance. The vertical deflection circuit should operate even under high voltage loading and high transient voltage loading, and permit triggering of the thyristors reliably and unambiguously.

SUBJECT MATTER OF THE PRESENT INVENTION

Briefly, the circuit utilizes a vertical deflection output stage having a saw-tooth wave generator connected in advance thereof and having thyristors which control charging and re-charging of the charge capacitor, utilizing a portion of the energy contained in the line retrace or line flyback and supplied from the line deflection circuitry to provide current for vertical deflection. In accordance with the present invention, and to ensure reliable triggering of the thyristors, the gates of the thyristors are biassed with a reverse-polarity bias during the pauses of triggering of the thyristors, that is, by applying a reverse polarity voltage to the gates of the thyristors when they are not being triggered.

In accordance with features of the invention, the gate bias for the thyristors can be obtained directly from the control circuit for the thyristors. This is a suitable voltage source and can be obtained, for example, by a transformer which has its primary connected to the control circuit. The secondary then provides the trigger pulses derived from the primary as well as a subsequent gate bias pulse due to the inductive kick-back. The secondary, therefore, will have the commanded trigger pulses applied and, during the pauses between trigger pulses, the gate of the thyristor will have a reverse polarity bias applied thereto.

In accordance with another embodiment, the gates of the thyristors can be coupled to the control circuit through a capacitor; the gates of the thyristors then will have the trigger pulses transferred and, during pauses, a negative bias will be applied.

The known vertical deflection circuit merely supplied trigger pulses to the thyristors; during pauses between trigger the thyristors were effectively electrically "floating" and the gates did not have any bias voltages of opposite polarity applied thereto. Inductive or capacitative coupling is a simple way to provide oppositely poled gate bias voltages during the pauses between trigger intervals, thus reducing the recovery time of the thyristors.

It is also possible to obtain gate voltages merely from the line retrace pulses, for example inductively, or to utilize these inductively generated bias voltages in addition to otherwise derived gate bias voltages. The gate bias voltages can also be obtained from a separate voltage source, for example from rectified line retrace signals.

The invention will be described by way of example with reference to the accompanying drawings, wherein:

FIG. 1 is a general highly schematic block circuit diagram of the vertical deflection circuitry of a television receiver and illustrating the present invention in block form; and FIGS. 2, 3, 4, 5, and 6 illustrate details of the circuits to obtain a reverse-polarity bias for the gates of the thyristors.

The basic circuit to which the invention relates is shown and described in U.S. Pat. No. 4,048,544, Hoferl.

A horizontal deflection output stage 1 is driven by a horizontal deflection transformer 2, of which only those coils used in the system of the present invention are shown. A portion of the energy in the retrace or line flyback is coupled by means of winding W1, W2 inductively from the transformer and stored in inductances L1, L2, and then applied through the anode-cathode path of respective thyristors $Th_1$ and $Th_2$ to a charge capacitor C. A control circuit 3 (see U.S. Pat. No. 4,048,544) is provided, connected to the gates of the thyristors, to so trigger the thyristors that the charge capacitor is first charged positively during the first half of the video scan and then charged negatively during the second half of the video scan. The charge capacitor C is discharged through the vertical deflection coils $L_{V1}$, $L_{V2}$ and a circuit 4 (see U.S. Pat. No. 4,048,544), functioning as the vertical correction circuit. A feedback resistor R is also provided, as known. The voltage drop across the feedback resistor R is applied to the control circuit 3 to ensure precise timing of the triggering of thyristors $Th_1$ and $Th_2$.

In accordance with the present invention, the pulses obtained from the control circuit 3 are applied through trigger pulse transfer circuits 5, 6, which provide a reverse bias to the gates of the thyristors $Th_1$ and $Th_2$ as well as the trigger pulses. The reverse bias applied upon termination of the trigger pulses decreases the recovery time of the thyristors $Th_1$ and $Th_2$. A portion of the energy supplied by the horizontal deflection output circuit and available at transformer 2 during the line retrace is thus directly utilized in order to supply current for the vertical deflection coils.

The subsequent figures show details of the circuits 5, 6 which may be identical.

FIG. 2: The output pulses of control circuit 3 (FIG. 1) are supplied from terminal 31 to the primary winding 7 of a transformer T. The pulses from control circuit 3 induce the trigger pulses in the secondary 8 as well as the oppositely poled bias voltage for the thyristor Th, connected to the secondary 8, for example any one of the thyristors $Th_1$ or $Th_2$. This bias pulse is derived due to collapse of the magnetic field upon termination of the trigger pulse applied from terminal 31, resulting in a reverse voltage swing.

FIG. 3: The pulses at terminal 31 are connected to a resistor $R_1$. A voltage proportional to the control current is dropped across resistor $R_1$. Change of this voltage results in a capacitative current through coupling capacitor $C_1$. This current on the one hand triggers thyristor Th and flows through the gate of the thyristor. Upon reverse current flow, that is, upon re-charging of the capacitor $C_1$, currents will flow through the resistor $R_2$ resulting in a voltage of opposite polarity across the resistor $R_2$ which provides the oppositely poled bias voltage as a gate bias voltage to the thyristor Th, thus decreasing its recovery time.

The oppositely poled gate bias voltage can also be derived inductively from the line retrace pulse.

In some circuits it may be necessary to obtain gate bias voltage at reverse polarity by a separate voltage source, for example a constant voltage source. This decreases the overall efficiency of the receiver since additional electric power is necessary to supply the required bias voltage.

Customary transistors used in vertical deflection circuits should have a negative gate bias voltage of at least about $-1.5$ V.

The vertical deflection circuit permits exact triggering of the thyristors even upon high transient voltage loading at the electrodes of the thyristors, since they will have a very rapid recovery time. This prevents overloading of the thyristors and other components of the vertical deflection circuitry, and results in an overall vertical deflection circuit of high reliability and assured operation.

In an operating example, the circuit of FIG. 3 had the following components:
$R_1$: 2.2k OHMs
$R_2$: 150 OHMs
$C_1$: 0.33 Microfarads
The thyristor Th was of the type 17120, RCA.

The capacitor $C_1$ should preferably be greater than 0.2 Microfarads. The resistor $R_2$ can be integrated with the thyristor, or be an integral high resistance gate.

Figure 5:
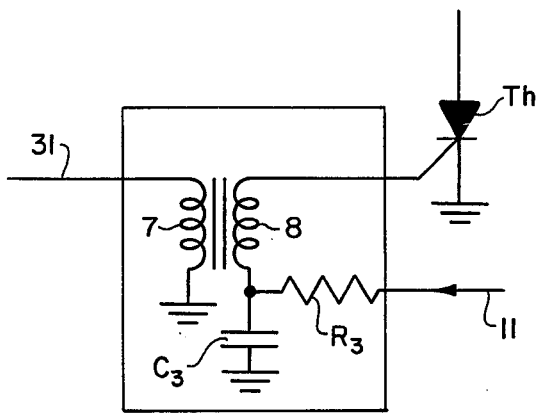
Figure 6:
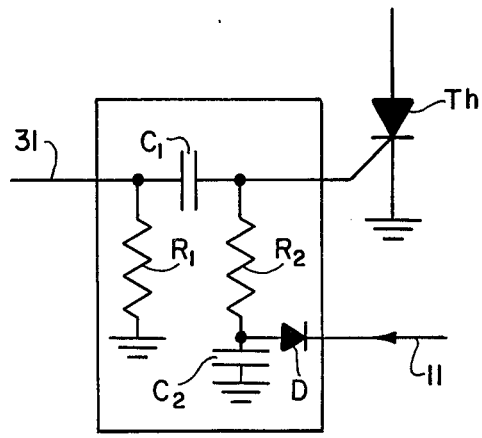

FIGS. 4 to 6 show modifications of the coupling circuits. The oppositely poled gate bias of suitable value is derived from line 11. Line 11 is connected to an auxiliary winding of the line transformer (not shown) of the television receiver.

Line 11, therefore, will have the retrace pulses applied. In FIG. 4, the line retrace pulses are rectified by diode D and smoothed by capacitor $C_2$. Thus, the thyristor Th will receive the oppositely poled gate bias during the trigger intervals, derived from the capacitor $C_2$. In the circuit of FIG. 5, the line retrace pulses which are coupled out from the line transformer and derived from line 11 are integrated by the combination R/C network formed by resistor $R_3$ and Capacitor $C_3$ which, together, form a low pass filter. The thus integrated pulses are applied, again, to the gate of the thyristor Th. FIG. 6 is a combination of the circuit of FIG. 4 and to the circuit of FIG. 3, in which similar elements have been given the same reference designation.

Various changes and modifications may be made, and features described in connection with any one of the embodiments may be used with any of the others, within the scope of the inventor's concept.

I claim:

1. In a deflection circuit for television receivers having vertical deflection coils ($L_{V1}$, $L_{V2}$):
    a vertical deflection stage having a saw-tooth wave generator including a charge capacitor (C), two thyristors ($Th_1$, $Th_2$) connected to the charge capacitor to charge, and re-charge the capacitor, and means (3) applying trigger pulses to the thyristors to control triggering thereof and hence the charge applied to the charge capacitor (C);
    and means (1, 2, $L_1$, $L_2$) connected to the horizontal deflection output stage (1) and applying part of the energy delivered by the horizontal deflection output stage to the vertical deflection stage to supply current to the vertical deflection coil
    means (5, 6) applying a bias voltage to the gates of the thyristors ($Th_1$, $Th_2$) during pauses of the trigger pulses, which is of a polarity which is reverse with respect to the polarity of the trigger pulses.

2. Circuit according to claim 1, wherein said reverse bias means (5, 6) are connected between said trigger pulse application means and the gates of the thyristors.

3. Circuit according to claim 1, wherein said bias voltage application means (5, 6) are connected to the trigger pulse application means (3) and derive the bias voltage from said trigger pulses.

4. Circuit according to claim 1, wherein the bias voltage of said reverse polarity is negative and has a value of at least about $-1.5$ V.

5. Circuit according to claim 1, wherein (FIG. 2) a coupling transformer (T) is provided having its primary (7) connected to the output of the trigger pulse application means and its secondary (8) connected to the gate of the respective thyristor to provide said reverse bias voltage to the gate of the thyristor upon termination of the trigger pulse.

6. Circuit according to claim 1, wherein said application means comprises a capacitor ($C_1$) connected between the trigger pulse application means (3) and the gate of the respective thyristor (Th).

7. Circuit according to claim 6, further comprising a dropping resistor ($R_1$) connected between the junction of the capacitor ($C_1$) and said trigger pulse application means (3) to provide a capacitative current due to the voltage drop across the resistor ($R_1$) upon occurrence of a trigger pulse, said capacitative current triggering the respective thyristor (Th);

and a second resistor ($R_2$) connected between the junction of the capacitor ($C_1$) and the gate of the respective thyristor (Th) and one of the main electrodes of the thyristor to provide for current flow over said second resistor ($R_2$) during pauses or gaps between said trigger pulses and causing a voltage drop across said second resistor of a polarity opposite to the polarity of the trigger pulses and thus applies said reverse-polarity bias voltage to the gate of the respective thyristor.

8. Circuit according to claim 1, further comprising coupling means connected to the horizontal output stage and deriving said bias voltage from the line retrace pulses arising in the horizontal deflection output stage.

9. Circuit according to claim 8, wherein said coupling means are inductive coupling means.

10. Circuit according to claim 8, wherein said coupling means include rectifier means to derive said reverse-polarity bias voltage from rectified horizontal line retrace pulses.

11. Circuit according to claim 1, wherein said means applying said bias voltage comprise a voltage source independent of the deflection circuit of the receiver and supplying said bias voltage of reverse polarity.

* * * * *